(12) United States Patent
Karabalin et al.

(10) Patent No.: US 12,408,561 B1
(45) Date of Patent: Sep. 2, 2025

(54) METHOD FOR PRODUCING TRANSMON QUBIT AND LITHIUM NIOBATE RESONATOR ON THE SAME SUBSTRATE

(71) Applicant: Amazon Technologies, Inc., Seattle, WA (US)

(72) Inventors: Rassul Karabalin, Huntington Beach, CA (US); William Maxwell Jones, Pasadena, CA (US); Patricio Arrangoiz Arriola, San Francisco, CA (US); Nasser Alidoust, Pasadena, CA (US); Gregory Scott MacCabe, Los Angeles, CA (US); David John Perello, Pasadena, CA (US); Matthew Sullivan Hunt, Pasadena, CA (US); Andrew Joseph Keller, San Francisco, CA (US); Gregory Peairs, Paradise Valley, AZ (US); Hesam Moradinejad, Pasadena, CA (US); Oskar Jon Painter, Sierre Madre, CA (US)

(73) Assignee: Amazon Technologies, Inc., Seattle, WA (US)

( * ) Notice: Subject to any disclaimer, the term of this patent is extended or adjusted under 35 U.S.C. 154(b) by 885 days.

(21) Appl. No.: 17/491,245

(22) Filed: Sep. 30, 2021

(51) Int. Cl.
*H10N 60/12* (2023.01)
*G06N 10/40* (2022.01)
(Continued)

(52) U.S. Cl.
CPC .............. *H10N 60/12* (2023.02); *G06N 10/40* (2022.01); *H03H 3/02* (2013.01); *H03H 9/131* (2013.01);
(Continued)

(58) Field of Classification Search
CPC .. H10N 60/12; H10N 60/805; H10N 60/0912; H10N 69/00; G06N 10/40
See application file for complete search history.

(56) References Cited

U.S. PATENT DOCUMENTS 8,301,214 B1 * 10/2012 Tolpygo ............... H10N 60/805
505/190
9,755,063 B1 * 9/2017 Howard ............ H01L 21/76801
(Continued)

OTHER PUBLICATIONS

Jens Koch, Terri M. Yu, Jay Gambetta, A. A. Houck, D. I. Schuster, J. Majer, Alexandre Blais, M. H., "Charge-insensitive qubit design derived from the Cooper pair box," Phys. Rev. A 76, 042319—Published Oct. 12, 2007, pp. 1-19.
(Continued)

*Primary Examiner* — Nathan W Ha
(74) *Attorney, Agent, or Firm* — Alexander A. Knapp; Kowert, Hood, Munyon, Rankin & Goetzel, P.C.

(57) ABSTRACT

A fabrication method and associated apparatus is disclosed where an electromechanical resonator made out of lithium niobate is fabricated on the same substrate as a Josephson Junction-based transmon qubit. The starting material may be a high resistivity silicon wafer with a thin layer of lithium niobate (LiNbO$_3$). The fabrication method may include removing lithium niobate selectively from the substrate to preserve the quality of the substrate. The selective removal maintains defect free qualities of the silicon surface, thus enabling the fabrication of high performance Josephson Junction-based transmon qubit on the surface.

20 Claims, 9 Drawing Sheets

(51) Int. Cl.
  *H03H 3/02* (2006.01)
  *H03H 9/13* (2006.01)
  *H03H 9/24* (2006.01)
  *H10N 60/01* (2023.01)
  *H10N 60/80* (2023.01)
  *H10N 69/00* (2023.01)
(52) U.S. Cl.
  CPC ...... *H03H 9/2426* (2013.01); *H10N 60/0912* (2023.02); *H10N 60/805* (2023.02); *H10N 69/00* (2023.02); *H03H 2003/027* (2013.01)

(56) References Cited

U.S. PATENT DOCUMENTS

| | | | | |
|---|---|---|---|---|
| 10,516,248 | B1* | 12/2019 | Taylor | H01S 3/1683 |
| 11,508,896 | B1* | 11/2022 | Yohannes | G06N 10/40 |
| 2004/0185339 | A1* | 9/2004 | Jones | H01M 50/24 |
| | | | | 429/177 |
| 2005/0063438 | A1* | 3/2005 | Capasso | H01S 5/187 |
| | | | | 372/50.21 |
| 2017/0322265 | A1* | 11/2017 | Berggren | G01R 33/0354 |
| 2018/0113373 | A1* | 4/2018 | Witmer | G02F 1/017 |
| 2019/0013463 | A1* | 1/2019 | Wu | H10N 50/01 |
| 2021/0409000 | A1* | 12/2021 | Tu | H03H 9/13 |
| 2022/0093683 | A1* | 3/2022 | Then | H10N 30/706 |
| 2022/0102614 | A1* | 3/2022 | Copel | H10N 69/00 |
| 2023/0116933 | A1* | 4/2023 | Tu | H03H 9/2405 |
| | | | | 310/349 |

OTHER PUBLICATIONS

Connor T. Hann, Chang-Ling Zou, Yaxing Zhang, Yiwen Chu, Robert J. Schoelkopf, S. M. Girvin, and Liang Jiang, "Hardware-Efficient Quantum Random Access Memory with Hybrid Quantum Acoustic Systems," Phys. Rev. Lett. 123, 250501—Published Dec. 17, 2019, pp. 1-7.

Marek Pechal, et al., "Superconducting circuit quantum computing with nanomechanical resonators as storage," Published Sep. 17, 2018 • © 2018 IOP Publishing Ltd, Quantum Science and Technology, pp. 1-10.

Christopher Chamberland, et al., "Building a fault-tolerant quantum computer using concatenated cat codes," arXiv:2012.04108 [quant-ph], 2020, pp. 1-118.

Patricio Arrangoiz-Arriola, et a., "Resolving the energy levels of a nanomechanical oscillator," Nature vol. 571, pp. 537-540 ( Jul. 2019).

Wikipedia, "Smart cut, " https://en.wikipedia.org/wiki/Smart_cut, This page was last edited on Apr. 23, 2021, at 16:33 (UTC), pp. 1-2.

A. Dunsworth, et al., "Characterization and reduction of capacitive loss induced by sub-micron Josephson junction fabrication in superconducting qubits," Appl. Phys. Lett. 111, 022601 (2017); https://doi.org/10.1063/1.4993577, (arXiv:1706.00879v1), pp. 1-9.

NGK Insulators, Ltd., "Bonded Wafer for SAW Filter Application: Overview," https://www.ngk-insulators.com/en/ roduct/electron/ wafer/saw/index.html, Copyright 1997-2021, pp. 1-3.

* cited by examiner

Forming, from a layer of protonatable piezoelectric material positioned on a silicon substrate, a structure of the protonatable piezoelectric material on the silicon substrate where the structure of the protonatable piezoelectric material is formed by defining and removing portions of the layer of the protonatable piezoelectric material on the silicon substrate through a combination of: (a) application of a proton exchange treatment to the layer of protonatable piezoelectric material with a patterned mask to cause proton exchange in exposed portions of the protonatable piezoelectric material followed by wet etching the layer of protonatable piezoelectric material to remove proton exchanged portions of the protonatable piezoelectric material and (b) removing portions of the layer of protonatable piezoelectric material using a dry etch process
2102

Forming an electrode layer on the silicon substrate where at least a portion of the electrode layer is formed over the structure of the protonatable piezoelectric material
2104

Forming a nonlinear element on the electrode layer at a position spaced apart from the structure of the protonatable piezoelectric material
2106

*Removing at least some of the silicon substrate under the structure of protonatable piezoelectric material to form a void below the structure of protonatable piezoelectric material*
2108

METHOD FOR PRODUCING TRANSMON QUBIT AND LITHIUM NIOBATE RESONATOR ON THE SAME SUBSTRATE

BACKGROUND

Quantum computing utilizes the laws of quantum physics to process information. Quantum mechanics is a theory that describes the behavior of reality at the fundamental level. It is currently the only physical theory that is capable of consistently predicting the behavior of microscopic quantum objects like photons, molecules, atoms, and electrons.

A quantum computer is a device that utilizes quantum mechanics to allow one to write, store, process and read out information encoded in quantum states, i.e., the states of quantum objects. A quantum object is a physical object that behaves according to the laws of quantum physics. The state of a physical object is a mathematical description of the object at a given time.

In quantum mechanics, the state of a two-level quantum system is a quantum bit, or qubit, and is a list of two complex numbers whose squares sum up to one. Each of the two numbers is called an amplitude, and their squared absolute values are the probabilities that a measurement of the qubit results in zero or one, respectively. A fundamental and counterintuitive difference between a probabilistic bit (e.g., a zero or one bit encoded in a system described by classical physics, like a coin) and the qubit is that a probabilistic bit represents a lack of information about a two-level classical system, while a qubit contains maximal information about a two-level quantum system.

Quantum computers are based on qubits, which may experience the phenomena of "superposition" and "entanglement." Superposition allows a quantum system to be in multiple states at the same time. For example, whereas a classical computer is based on bits that are either zero or one, a qubit may be both zero and one at the same time, with different probabilities assigned to zero and one. Entanglement is a strong correlation between quantum systems, such that the quantum systems are inextricably linked even if separated by great distances.

A quantum algorithm is a reversible transformation acting on qubits in a desired and controlled way, followed by a measurement on one or multiple qubits. For example, if a system has two qubits, a transformation may modify four numbers; with three qubits this becomes eight numbers, and so on. As such, a quantum algorithm acts on a list of numbers that is exponentially large as dictated by the number of qubits. To implement a transform, the transform may be decomposed into small operations acting on a single qubit, or a set of qubits, as an example. Such small operations are called quantum gates and a specific arrangement of the gates implements a quantum algorithm.

There are different types of two-level quantum objects that may be used in quantum computers, each having different advantages and disadvantages. For example, some quantum computers may include qubits encoded in superconductors, trapped ions, electron spins, photons, etc. Each may experience different levels errors and decoherence. Also, some may be more useful for implementing particular types of quantum algorithms, while others may be more useful for implementing other types of quantum algorithms. Also, costs, run-times, error rates, availability, etc. may vary across quantum computing technologies. One approach that is actively being researched uses nonlinear superconducting circuits coupled to resonators. The resonators are used as memory elements to store qubits and can be of any type, such as a superconducting cavities or mechanical resonators.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

The present disclosure relates to fabrication methods for quantum computing devices that utilize electromechanical resonators.

One of the most popular implementations of quantum computing are superconducting circuits. They are often comprised of a Josephson Junction shunted by a capacitor, a configuration typically referred to as a transmon qubit. Certain quantum processor architectures utilize, as a basic building block, a linear resonator strongly coupled to a transmon or some other kind of nonlinear superconducting circuit. Electromechanical resonators have multiple advantages over purely electrical ones such as small size and potentially superior quality factors. However, it has been challenging to integrate electromechanical resonator and a transmon within the same fabrication process flow, while preserving transmon performance and strong coupling between the elements.

Transmon performance, which is typically measured by coherence times $T_1$ and $T_2$, is very sensitive to substrate and material purity. Therefore, a very specific set of procedures, involving substrate cleaning and special surface treatments, often needs to be performed during device fabrication. One way to provide strong coupling between mechanical motion and electrical charge is via the piezoelectric effect. This way, however, requires the processing of piezoelectric material on the same substrate where the transmon is built. Processing of piezoelectric material on the same substrate where the transmon is built (e.g., on the same silicon substrate) may be difficult to implement while maintaining suitable operating properties for a quantum computing device.

In various implementations, lithium niobate can be grown as high purity crystal boules using the Czochralski method. Then, a thin layer of pure lithium niobate is bonded to a high resistivity silicon wafer using, for example, a smart-cut technique. High resistivity silicon wafers with low dopant and low interstitial oxygen concentrations have been shown to provide a great substrate for transmon qubits with $T_1$ times of order of 100 microseconds (μs). However, if the pristine silicon surface is subjected to any physical ion bombardment during processing, such as during over-etch while patterning the lithium niobate film, the performance is degraded. A commonly known method to pattern lithium niobate involves dry etching with low selectivity to silicon. This process, however, subjects the silicon substrate surface to excessive ion bombardment, thereby degrading transmon performance.

The present disclosure provides a fabrication method where lithium niobate is selectively patterned (lithium niobate being one of the piezoelectric materials with the largest electromechanical coupling) to preserve the quality of the substrate (e.g., high resistivity silicon). For instance, a proton exchange treatment process, as described herein, may be implemented for selectively patterning of a layer of lithium niobate on a silicon substrate. Quantum computing devices (such as nonlinear superconducting elements) made by the disclosed method demonstrate high $T_1$ and $T_2$ for a transmon fabricated on a substrate where lithium niobate was selectively etched.

Figure 1:
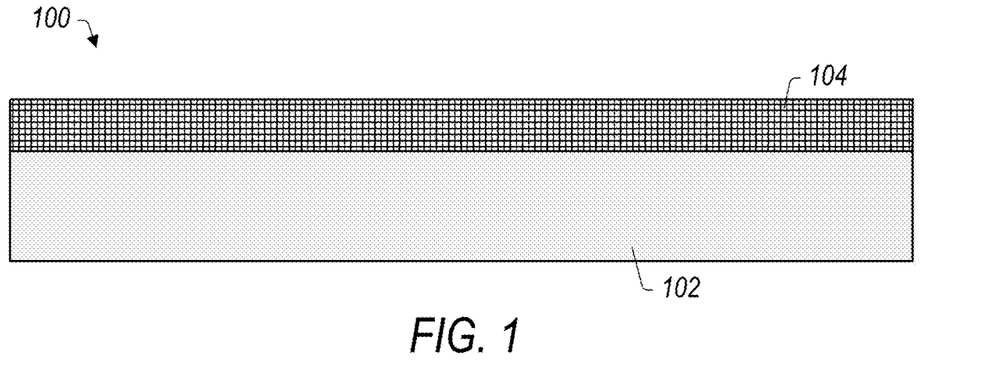
FIG. 1 depicts a cross-sectional representation of an embodiment of a substrate for a quantum computing device.
Figure 10:
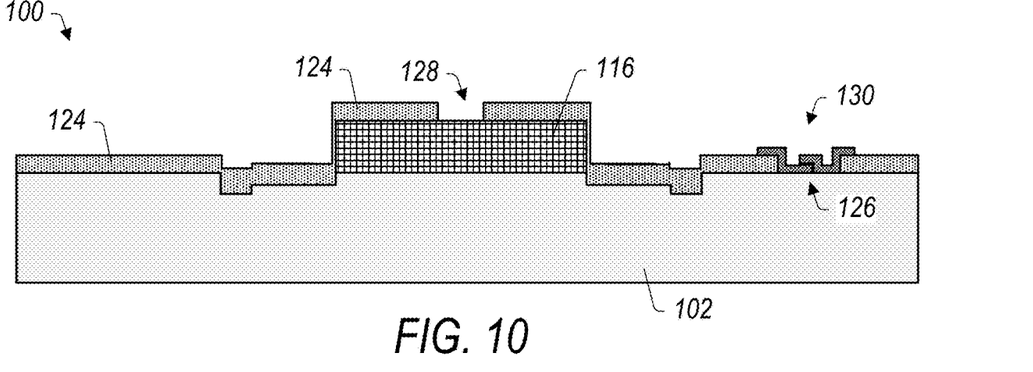
FIG. 10 depicts a cross-sectional representation of a substrate with a nonlinear element formed on the substrate, according to some embodiments.
Figure 11:
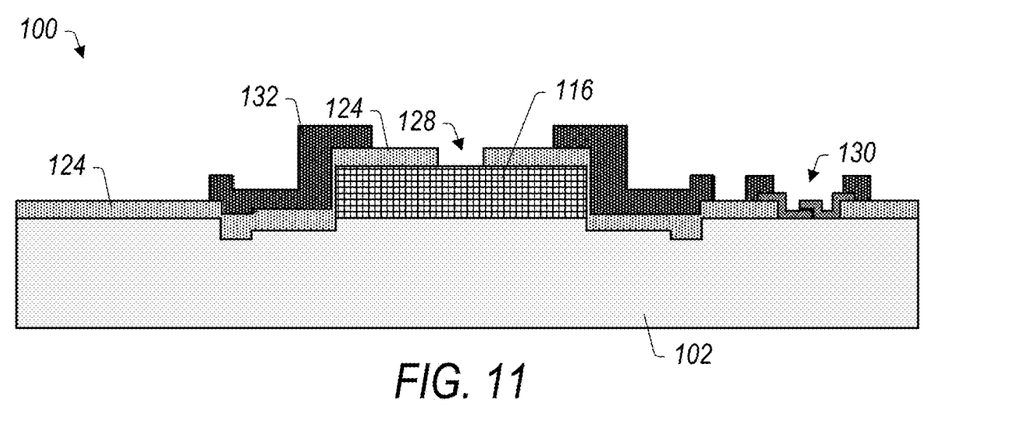
FIG. 11 depicts a cross-sectional representation of a substrate with a bandage layer formed on the substrate, according to some embodiments.
Figure 12:
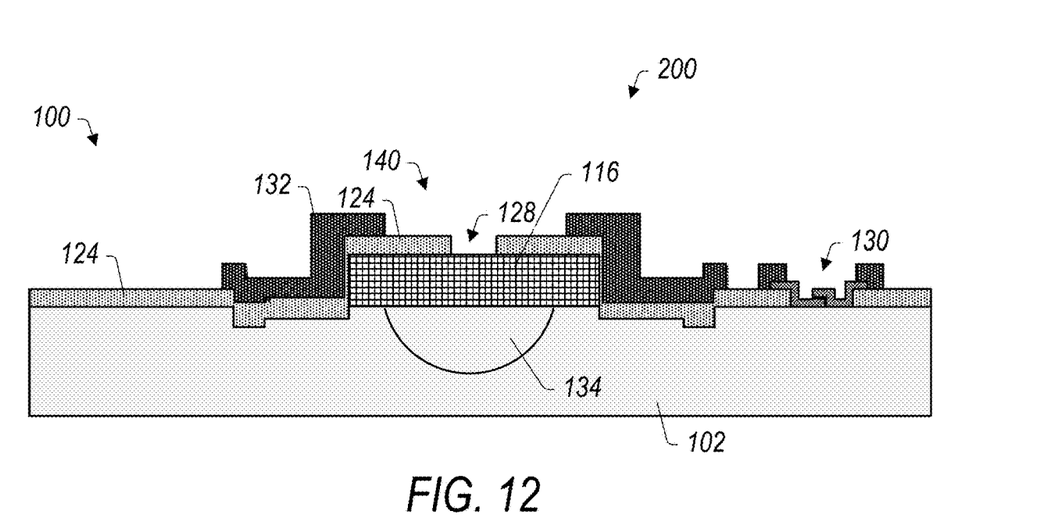
FIG. 12 depicts a cross-sectional representation of a substrate with an acoustic resonator and a nonlinear element formed on the substrate, according to some embodiments.

FIGS. 1-12 depict cross-sectional representations of various steps in a method for fabricating a quantum computing device on a silicon substrate. FIG. 12 depicts an example of a quantum computing device fabricated according to the disclosed embodiments. FIG. 1 depicts a cross-sectional representation of an embodiment of a substrate 100 for a quantum computing device. In the illustrated embodiment, substrate 100 includes silicon substrate 102 with lithium niobate layer 104 coupled to (e.g., bonded to) the silicon substrate. Silicon substrate 102 may be, for example, a bulk silicon substrate with high resistivity. In various embodiments, silicon substrate 102 has a surface roughness on the order of at most about 1 nm.

In various embodiments, lithium niobate layer 104 is a layer of single crystal lithium niobate. For instance, lithium niobate layer 104 may be a X-cut lithium niobate layer. Lithium niobate layer 104 may be thin compared to the thickness of silicon substrate 102. For example, in one embodiment, lithium niobate layer 104 has a thickness on the order of 250 nm. Other thicknesses may, however, also be implemented depending on the desired operating properties of a quantum computing device formed on substrate 100. For example, the thickness of lithium niobate layer 104 may vary between about 100 nm and about 500 nm or other ranges therein.

Typically, substrate 100 (e.g., silicon substrate 102 with lithium niobate layer 104 bonded to the silicon substrate) may be prefabricated and procured from vendors known in the surface acoustic wave industry. For instance, a substrate 100 may be obtained from NGK Insulators, LTD (Japan). In some embodiments, a lithium niobate layer 104 in substrate 100 may be thicker than desired on a prefabricated substrate. In such embodiments, lithium niobate layer 104 may be dry etched to thin the layer to a desired thickness.

While embodiments disclosed herein implement lithium niobate as the material for generating an electromechanical (acoustic) resonator, other materials may also be contemplated without deviating from the scope of the fabrication processes and devices described herein. For instance, in certain embodiments, lithium niobate is a protonatable piezoelectric material. As used herein, a "protonatable piezoelectric material" is a piezoelectric material that is proton exchangeable. Thus, protonatable piezoelectric material may be used interchangeably with lithium niobate in the fabrication processes and devices described herein. Examples of protonatable piezoelectric materials include, but are not limited to, lithium-based salts (such as lithium niobate or lithium tantalate) or other lithium-based materials that are protonatable. In certain embodiments, a protonatable piezoelectric material is a single crystal material. For example, the protonatable piezoelectric material may be a single crystal lithium-based salt. Embodiments with non-single crystal protonatable piezoelectric material may also be contemplated.

Figure 2:
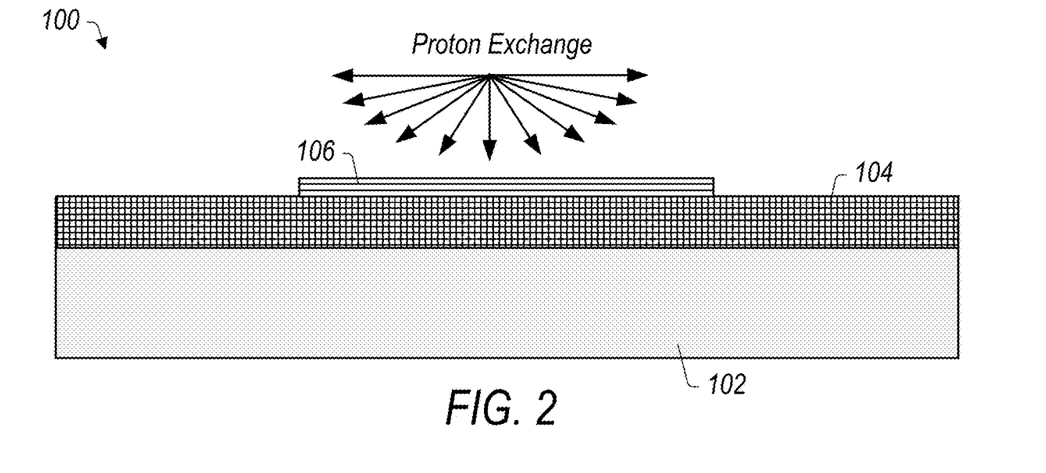
FIG. 2. depicts a cross-sectional representation of a mask formed over a lithium niobate layer, according to some embodiments

In certain embodiments, a mask is placed over lithium niobate layer 104 to define a pattern of one or more islands of lithium niobate on silicon substrate 102. FIG. 2 depicts a cross-sectional representation of mask 106 formed over lithium niobate layer 104, according to some embodiments. While a single "island" of mask 106 is depicted in FIG. 2, it is to be understood that mask 106 may include several islands or other structures defined in a pattern across the surface of lithium niobate layer 104. Mask 106 may be, for example, a proton etch mask or other metal hard mask. Any material that is stable in hydrogen rich acid (such as benzoic acid) may be used for mask 106. In one contemplated embodiment, mask 106 is formed by positioning a titanium layer on lithium niobate layer 104 and then defining a pattern for mask 106 using electron-beam lithography (e-beam lithography) and using liftoff. Other embodiments using photolithography and dry/wet etch may be contemplated for forming mask 106.

In various embodiments, mask 106 protects areas of lithium niobate layer 104 with dimensions larger than the dimensions intended for any final structures of lithium niobate. Larger areas may be protected by mask 106 to allow for over-etching of lithium niobate or other materials with the final dimensions determined by subsequent processing. After mask 106 is in position, the surface of substrate 100 may be exposed to a proton exchange treatment, as shown in FIG. 2. Proton exchange treatment of substrate 100 may include, for example, submerging the substrate in hydrogen rich acid (such as benzoic acid) at an elevated temperature for a period of time. For example, in one embodiment, substrate 100 may be submerged for 30 minutes in benzoic acid at a temperature of about 280° C. Other hydrogen rich acids may also be implemented such as, but not limited to, citric acid or acetic acid. In various embodiments, the proton exchange treatment is an isotropic process (e.g., non-directional process), as shown in FIG. 2

Figure 3:
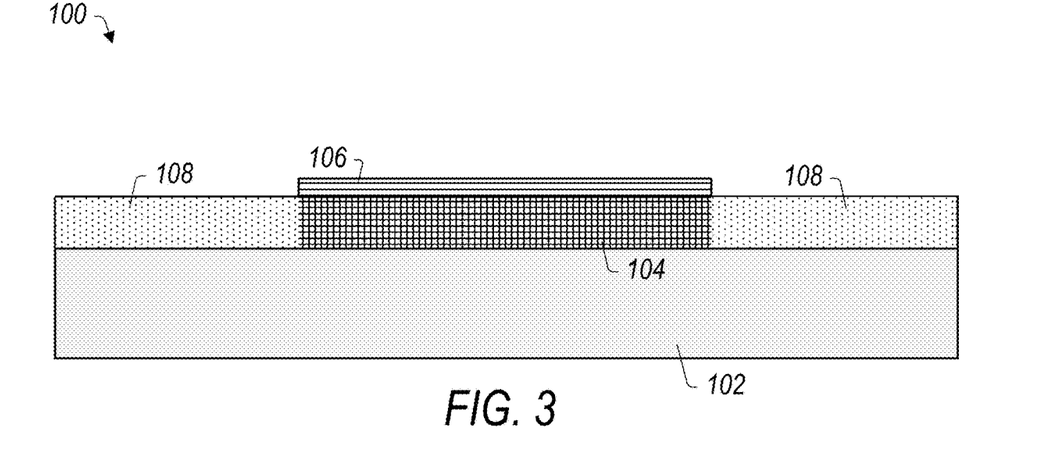
FIG. 3 depicts a cross-sectional representation of a proton exchange treatment, according to some embodiments.

FIG. 3 depicts a cross-sectional representation of substrate 100 after the proton exchange treatment, according to some embodiments. During the proton exchange treatment, hydrogen from the acid replaces lithium ions in unprotected (e.g., unmasked) portions of lithium niobate layer 104. For instance, as shown in FIG. 3, unprotected portions of lithium niobate layer 104 become proton exchanged regions 108. The depth of proton exchange in regions 108 may depend on time, temperature, and/or acid strength. The time and temperature for a specific thickness of lithium niobate layer 104 may be determined, for example, using a diffusion equation.

Figure 4:
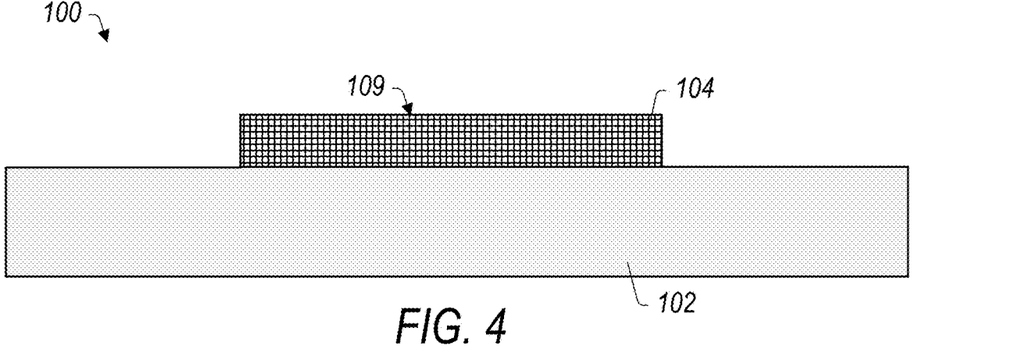
FIG. 4 depicts a cross-sectional representation of a substrate after a wet etch process, according to some embodiments.

After the proton exchange treatment, proton exchanged regions 108 may be removed using a wet etch process. FIG. 4 depicts a cross-sectional representation of substrate 100 after the wet etch process, according to some embodiments. In the illustrated embodiment, mask 106 has also been removed from substrate 100. Mask 106 may be removed before, after, or during the wet etch process depending on the materials used for the mask and the wet etch. For instance, in embodiments with a titanium mask and hydrofluoric (HF) acid for wet etching, the titanium mask may be removed during the wet etch process.

In one embodiment, the wet etch process is implemented by placing substrate 100 in concentrated hydrofluoric (HF) acid. HF acid is selective in removing proton exchanged regions 108 (e.g., protonated lithium niobate) versus non-proton exchanged regions (e.g., protected regions of lithium niobate layer 104 with unprotonated lithium niobate). For instance, in one example, HF acid may remove protonated lithium niobate at an etch rate of about 32 nm/min while unprotonated lithium niobate is removed at a rate of less than about 1 nm/min. Accordingly, an etch time may be implemented to minimize the removal of unprotonated lithium niobate. Additional embodiments may be contemplated that implement a dry etch process that is selective between protonated lithium niobate and unprotonated lithium niobate.

After the wet etch process, unprotonated lithium niobate in lithium niobate layer 104 is left as lithium niobate structure 109. Lithium niobate structure 109 may be an island structure or other three-dimensional structure on silicon substrate 102. As is known in the semiconductor processing industry, silicon in silicon substrate 102 is largely unaffected by exposure to HF acid. Accordingly, a smooth, relatively unaffected silicon substrate 102 surface is left surrounding lithium niobate structure 109.

Figure 5:
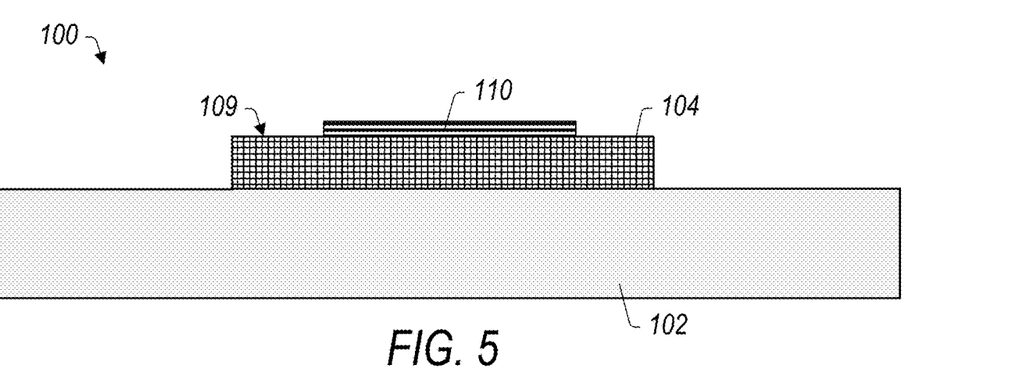
FIG. 5 depicts a cross-sectional representation of a substrate with a lithium niobate structure mask, according to some embodiments.

After lithium niobate structure 109 is defined on silicon substrate 102, a mask defining a final (and more finely tuned) lithium niobate structure may be formed on substrate 100. FIG. 5 depicts a cross-sectional representation of substrate 100 with lithium niobate structure mask 110, according to some embodiments. In the illustrated embodiment, mask 110 is formed on lithium niobate structure 109. In various embodiments, mask 110 is formed from silicon dioxide ($SiO_2$). For example, silicon dioxide may be spin-on silicon dioxide deposited on substrate 100 and then patterned using e-beam lithography.

In certain embodiments, mask 110 defines boundaries and dimensions in lithium niobate structure 109 such that an acoustic resonator structure and anchors can be formed from the lithium niobate structure 109 during further processing. For example, in some embodiments, mask 110 may define minimum dimensions of about 100 nm. E-beam lithography may be suitable for defining such dimensions. Other patterning methods may include, but not be limited to, deep-UV photolithography, resist mask patterning, or other hard mask patterning.

Figure 6:
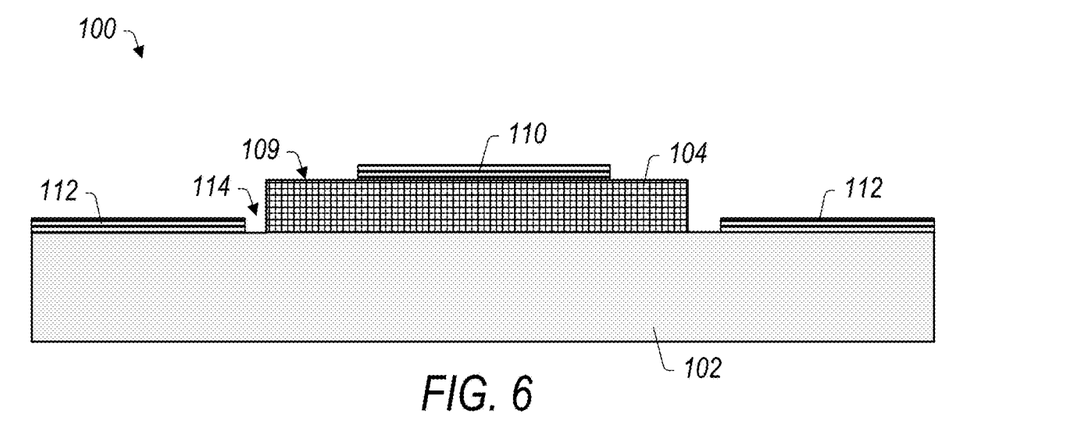
FIG. 6 depicts a cross-sectional representation of a substrate with a lithium niobate structure mask and a silicon substrate mask, according to some embodiments.

In various embodiments, a mask is also placed over exposed portions of silicon substrate 102. FIG. 6 depicts a cross-sectional representation of substrate 100 with lithium niobate structure mask 110 and silicon substrate mask 112, according to some embodiments. Mask 110 and mask 112 may be etch masks for protection of underlying features during further processing by an etch process. In some embodiments, mask 112 is formed in a separate, subsequent processing step from mask 110, even in instances where mask 110 and mask 112 are formed from the same material. In some embodiments, mask 112 is formed at the same time and from the same materials as mask 110. Mask 112 may protect large portions of silicon substrate 102 outside lithium niobate structure 109 from being damaged or affected during subsequent etch processing to form the final, more detailed lithium niobate structure.

In the illustrated embodiment, mask 112 is spaced a small distance away from the walls of lithium niobate structure 109 (represented by gap 114 in FIG. 6). Gap 114 may be allowed during processing to avoid inadvertent covering of lithium niobate structure 109 by mask 112. Various embodiments may, however, be contemplated where gap 114 is not present and mask 112 is close to the walls of lithium niobate structure 109. In such embodiments, there may be overlap between mask 112 and the walls of lithium niobate structure 109.

Figure 7:
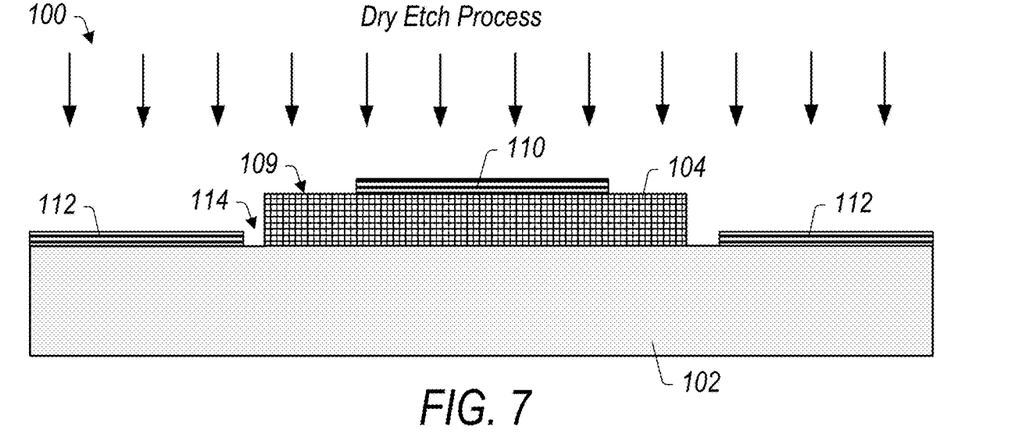
FIG. 7 depicts a cross-sectional representation of a substrate with a lithium niobate structure mask and a silicon substrate mask being subjected to a dry etch process, according to some embodiments.

After mask 110 and mask 112 are positioned on substrate 100, an etch process may be implemented to form a lithium niobate structure with final dimensions (e.g., dimensions for an acoustic resonator structure). FIG. 7 depicts a cross-sectional representation of substrate 100 with lithium niobate structure mask 110 and silicon substrate mask 112 being subjected to a dry etch process, according to some embodiments. The dry etch process may be performed using gases or dry chemicals known to be capable of removing unprotonated lithium niobate. In certain embodiments, the dry etch process is an anisotropic (e.g., directional) dry etch process. In some embodiments, a brief HF acid dip or other mask removal process may be used after dry etching to clear masks 110 and 112 from substrate 100.

Figure 8:
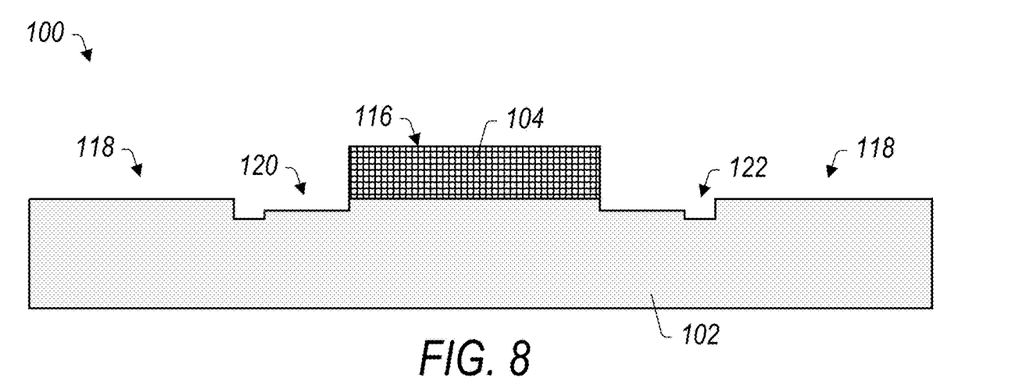
FIG. 8 depicts a cross-sectional representation of a substrate with a lithium niobate structure formed by a dry etch process and after mask removal, according to some embodiments.

As shown in FIG. 7, gap 114 may allow some etching of silicon substrate 102 between walls of lithium niobate structure 109 and mask 112. Such etching may form "moats" or other concave structures in silicon substrate 102, as shown in FIG. 8 below. In embodiments where gap 114 is not present and mask 112 overlaps the walls of lithium niobate structure 109, there may be some height variation across the exposed area of the lithium niobate structure. This outcome may, however, be minimal due to relaxed minimum dimension rules and alignment requirements during lithography and/or the use of thick resist during lithography.

FIG. 8 depicts a cross-sectional representation of substrate 100 with lithium niobate structure 116 formed by the dry etch process and after mask removal, according to some embodiments. In the illustrated embodiment, lithium niobate structure 116 is formed as defined by the dimensions of mask 110 (shown in FIG. 7). Lithium niobate structure 116 may have the dimensions and structure defined for an acoustic resonator structure in a quantum computing device.

As shown in FIG. 7, mask 112 protects various portions of silicon substrate 102 from the dry etch process. Accordingly, in FIG. 8, these protected portions form regions 118 that have relatively pristine silicon substrate. For instance, regions 118 have a surface smoothness (which may be defined by surface roughness, as described herein) on the order of a polished silicon substrate. Conversely, areas 120 along the walls of lithium niobate structure 116 have some etching/roughening of silicon substrate 102. Additionally, in embodiments with gaps 114 during the dry etch process (shown in FIG. 7), the gaps may allow etching/roughening that forms concave structures 122 (e.g., moats) in silicon substrate 102. However, as most of silicon substrate 102 has been protected by mask 112, regions 118 are larger in scale than areas 120 and concave structures 122.

Figure 9:
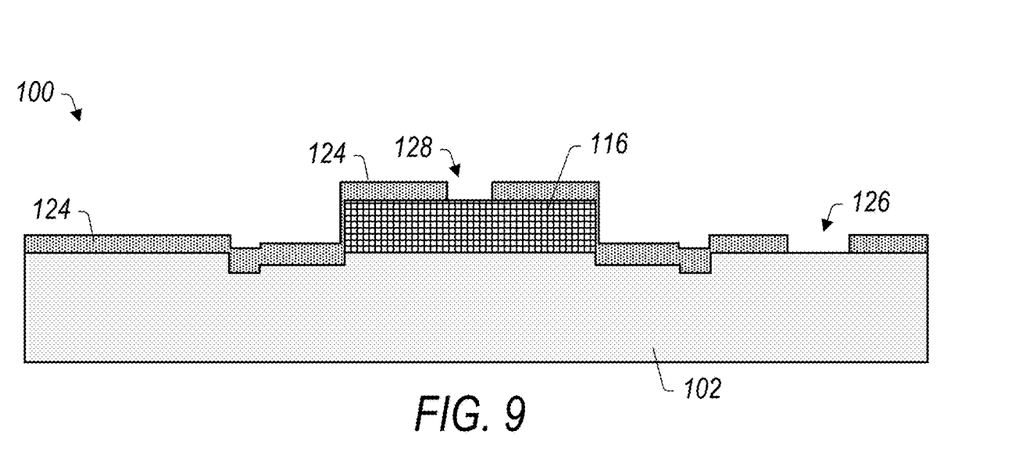
FIG. 9 depicts a cross-sectional representation of a substrate with a superconducting electrode layer formed on the substrate, according to some embodiments.

After the formation of lithium niobate structure 116 on silicon substrate 102, further processing may be implemented to generate a quantum computing device from the silicon substrate. Further processing may include, for example, the deposition and patterning of superconducting and/or metal layers to form devices. FIG. 9 depicts a cross-sectional representation of substrate 100 with superconducting electrode layer 124 formed on the substrate, according to some embodiments. In the illustrated embodiment, superconducting electrode layer 124 is formed over surfaces of both silicon substrate 102 and lithium niobate structure 116. In certain embodiments, superconducting electrode layer 124 is formed using a directional (e.g., anisotropic) deposition process such that little to none of the superconducting electrode layer is deposited on vertical walls of lithium niobate structure 116, as shown in FIG. 9.

In some embodiments, superconducting electrode layer 124 is formed using a conformal deposition process. Using a conformal deposition process may reduce the need for later deposition of a bandage layer (e.g., bandage layer 132, shown in FIG. 11).

In some embodiments, opening(s) 126 in superconducting electrode layer 124 is formed (e.g., patterned) above silicon substrate 102 and opening 128 in superconducting electrode layer 124 is formed (e.g., patterned) above lithium niobate structure 116. Openings 126 and 128 may allow contact to silicon substrate 102 and/or lithium niobate structure 116 for further structures formed on substrate 100. In certain embodiments, openings 126 are formed over portions of silicon substrate 102 having a smooth surface (e.g., regions 118 described above). In various embodiments, the smooth surface of the portions of silicon substrate 102 under openings 126 may be defined by a surface roughness measurement that can be measured by metrology techniques (e.g., a measure for roughness may be a root mean square of the surface profile, expressed in nm). For instance, in certain embodiments, the portions of silicon substrate 102 under openings 126 may have a surface roughness of at most about 2 nm. In some embodiments, the portions of silicon substrate 102 under openings 126 may have a surface roughness of at most about 1 nm. The portions of silicon substrate 102 under openings 126 having a smooth surface may produce a higher quality device as the smooth surface is positioned under a nonlinear element (e.g., nonlinear element 130, described herein). Such devices with smooth surfaces under the nonlinear element may, for example, have higher coherence times than devices with rough surface under the nonlinear element, as described below.

In certain embodiments, superconducting electrode layer 124 is formed over a large area of substrate 100. Superconducting electrode layer 124 may be, for example, an aluminum layer formed over a large area of substrate 100. Superconducting electrode layer 124 may then be patterned to provide desired structures (e.g., openings 126, 128) on the layer. Patterning may be implemented, for example, using e-beam patterning along with evaporation and liftoff or a dry etch process. In various embodiments, superconducting electrode layer 124 is a base electrode layer that is patterned to form various electrodes that may be utilized in a quantum computing device. Examples of electrodes that may be patterned and implemented in superconducting electrode layer 124 include, but are not limited to, an electrode that actuates and reads out mechanical motion, a transmission line, a waveguide resonator, a ground plane, or combinations thereof.

In certain embodiments, after superconducting electrode layer 124 is deposited and patterned on substrate 100, additional processing is provided to form additional structures on the substrate. FIG. 10 depicts a cross-sectional representation of substrate 100 with nonlinear element 130 formed on the substrate, according to some embodiments. In the illustrated embodiment, nonlinear element 130 is formed at the location of opening 126 on silicon substrate 102 (e.g., above the smooth surface of the silicon substrate). In certain embodiments, nonlinear element is a nonlinear superconducting element. In various embodiments, nonlinear element 130 is a junction-based nonlinear superconducting element or a transmon. In one embodiment, nonlinear element 130 is a Josephson Junction-based transmon qubit. Nonlinear element 130 may, however, be any other nonlinear superconducting device for implementation in a quantum processor.

One contemplated method for forming nonlinear element 130 includes using three-dimensional e-beam patterning with a multilayer e-beam resist followed by aluminum evaporation (e.g., double angle aluminum evaporation) with oxidation in between aluminum evaporations steps for insulation formation, and then liftoff. Such a method provides electrical access to two separate conducting aluminum layers in addition to a thin insulating (oxidation) layer between the aluminum layers. In various embodiments, the three-dimensional e-beam patterning forms a Dolan-Bridge Junction in nonlinear element 130.

In various embodiments, there may be an uncertainty in connection along superconducting electrode layer 124 due to process variations. For example, if directional deposition of superconducting electrode layer 124 is implemented, vertical or steep walled structures may have little to no electrode layer formed on the walls, which may cause defects in the device. Thus, in certain embodiments, a bandage layer (e.g., a metal layer) may be formed on substrate 100 to ensure an uninterrupted superconducting path between elements on the substrate. For instance, a bandage layer may be formed to ensure an uninterrupted superconducting path between nonlinear element 130, an acoustic resonator electrode at lithium niobate structure 116, a ground plane, and other circuit elements.

FIG. 11 depicts a cross-sectional representation of substrate 100 with bandage layer 132 formed on the substrate, according to some embodiments. Bandage layer 132 may be a metal (e.g., aluminum) layer that is patterned to form connections at possible break points in superconducting electrode layer 124. For example, bandage layer 132 may be patterned to be positioned along and near walls of lithium niobate structure 116 and near nonlinear element 130, as shown in FIG. 11.

In various embodiments, bandage layer 132 is formed by patterning using e-beam lithography. After e-beam lithography patterning, ion milling may be used to remove native oxide. Evaporation for aluminum deposition and liftoff is then implemented to form bandage layer 132 in desired locations. In some embodiments, photolithography may be used for patterning. In some embodiments, multiple resist layers and three-dimensional e-beam lithography may be implemented to create metal (aluminum) bridges in bandage layer 132. Bridges may provide extra metallization layering to enable better ground plane connectivity and/or flexible routing.

FIG. 12 depicts a cross-sectional representation of substrate 100 with acoustic resonator 140 and nonlinear element 130 formed on the substrate, according to some embodiments. In the illustrated embodiment, acoustic resonator 140 is formed by the combination of lithium niobate structure 116, superconducting electrode layer 124, and bandage 132 along with void 134 formed in silicon substrate 102. Void 134 may be formed by forming a mask (e.g., a release mask) on substrate 100 that is patterned via lithography with a thick resist layer. Silicon in silicon substrate 102 under the mask is then etched (e.g., using a $XeF_2$ isotropic silicon etch) to form void 134, thereby forming acoustic resonator 140.

Device 200, shown in FIG. 12, represents an example of a quantum computing device formed on the original substrate 100 (shown in FIG. 1) by the combination of acoustic resonator 140 and nonlinear element 130. In certain embodiments, as shown in FIG. 12, acoustic resonator 140 is positioned in proximity to nonlinear element 130 on silicon substrate 102 with at least some spacing between the nonlinear element and the acoustic resonator on the silicon substrate. Accordingly, acoustic resonator 140 and nonlinear element 130 are spaced apart on silicon substrate 102 and in device 200.

In certain embodiments, because nonlinear element 130 is formed over a smooth portion of silicon substrate 102, as described above, device 200 has properties on the order of baseline qubits fabricated on high resistivity pristine silicon substrate devices. Additionally, device 200 has better electrical properties than devices with rough silicon surfaces underneath the nonlinear element. For example, device 200 may have coherence times of at least about 10 μs while devices with rough surfaces have coherence times on the order of 1 μs. In some embodiments, device 200 may have higher coherence times. For example, in various embodiments, device 200 may have coherence times of at least about 90 μs. Further refinement of processing may be further capable of increasing the coherence times.

In embodiments with bridges in bandage layer 132, formation of void 134 (shown in FIG. 12) may be implemented before formation of the bandage layer. In such embodiments, fewer process steps with suspended structures may be implemented. The order of steps may be dependent on which implementation is more stable (e.g., with or without bridges). Alternatively, bridges may be fabricated with separately patterned scaffolding if the scaffolding is amenable to dry or vapor release.

Figure 13:
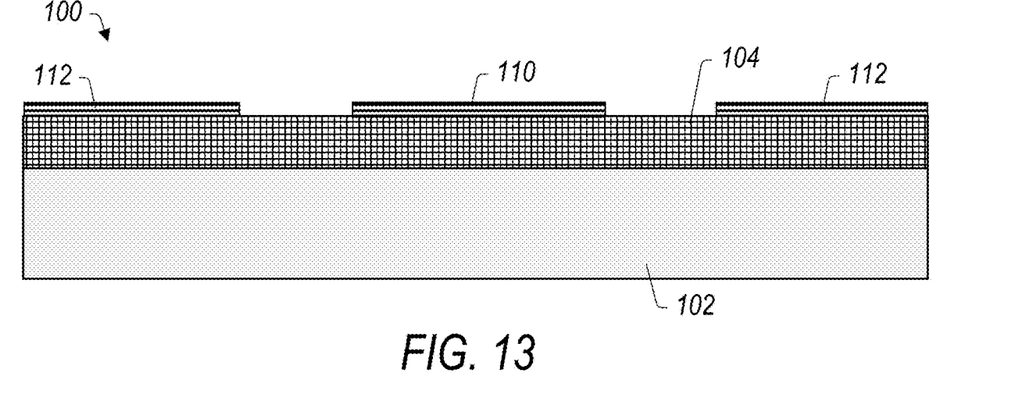
FIG. 13 depicts a cross-sectional representation of a substrate with masks formed on a lithium niobate layer, according to some embodiments.
Figure 14:
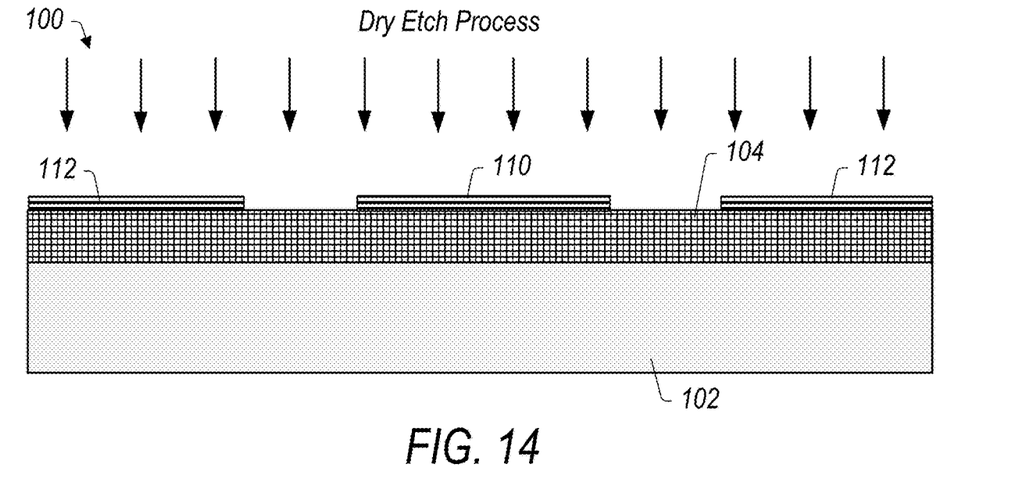
FIG. 14 depicts a cross-sectional representation of the substrate from FIG. 13 being dry etched, according to some embodiments.

In some contemplated embodiments, the steps described in FIGS. 5-8 (e.g., forming mask 110 and mask 112 followed by dry etching to form lithium niobate structure 116) may be performed before the steps described in FIGS. 2-4 (e.g., forming mask 106, proton exchange treatment, and protonated lithium niobate removal). FIGS. 13-20 depict cross-sectional representations of various steps in such a fabrication method embodiment. FIG. 13 depicts a cross-sectional representation of substrate 100 with mask 110 and mask 112 formed on lithium niobate layer 104, according to some embodiments. FIG. 14 depicts a cross-sectional representation of substrate 100 from FIG. 13 being dry etched, according to some embodiments.

Figure 15:
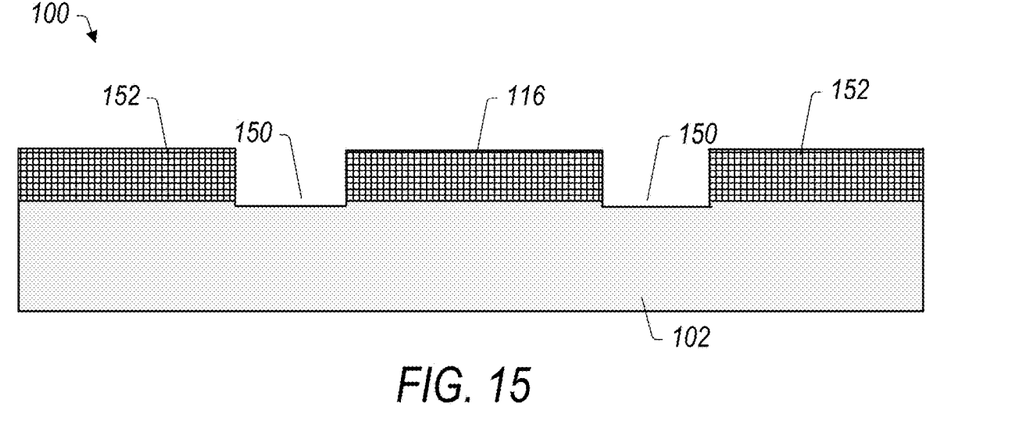
FIG. 15 depicts a cross-sectional representation of the substrate from FIG. 13 after dry etching and mask removal, according to some embodiments.

FIG. 15 depicts a cross-sectional representation of substrate 100 from FIG. 13 after dry etching and mask removal, according to some embodiments. As shown in FIG. 15, forming mask 110 and mask 112 followed by dry etching to form lithium niobate structure 116 may leave the patterned lithium niobate structure 116 along with a large area of substrate 100 covered with lithium niobate regions 152 (e.g., unprotonated lithium niobate). Areas 150 may be positioned between lithium niobate structure 116 and regions 152. In various embodiments, areas 150 may have a roughened silicon surface due to overetching from the dry etch process (similar to areas 120, shown in FIG. 8).

Figure 16:
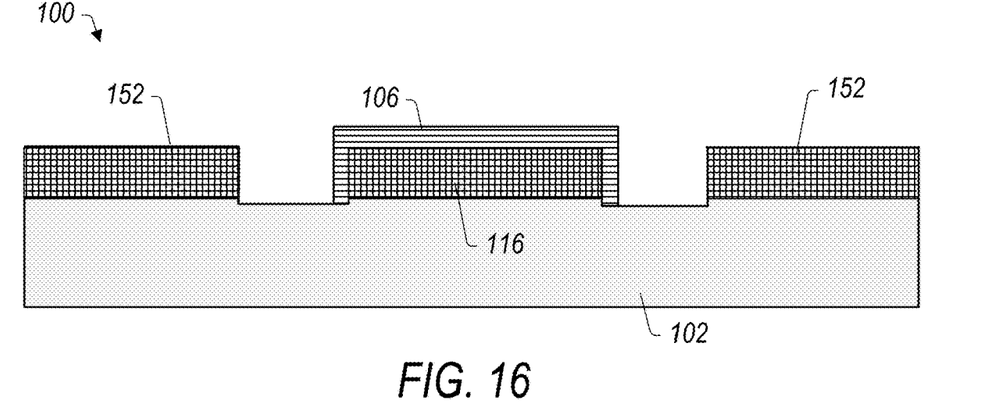
FIG. 16 depicts a cross-sectional representation of the substrate from FIG. 15 with a mask formed, according to some embodiments.
Figure 17:
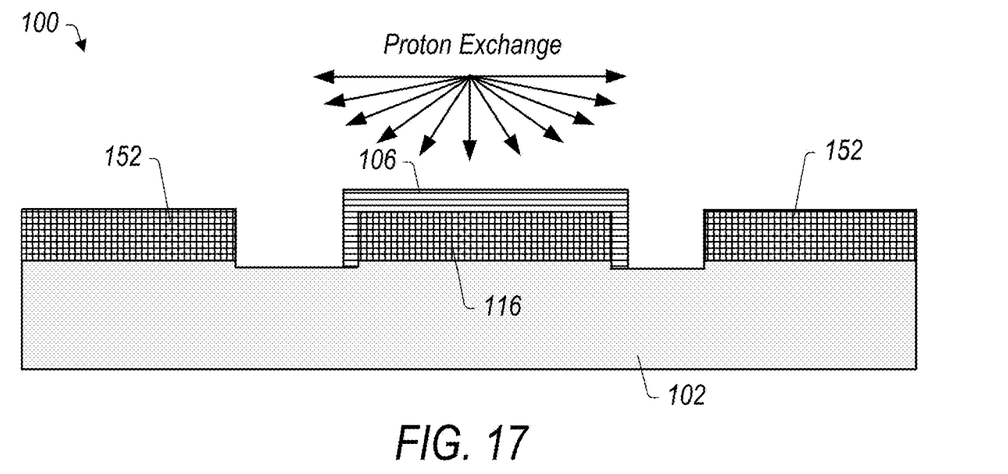
FIG. 17 depicts a cross-sectional representation of the substrate from FIG. 16 during proton exchange treatment, according to some embodiments.
Figure 18:
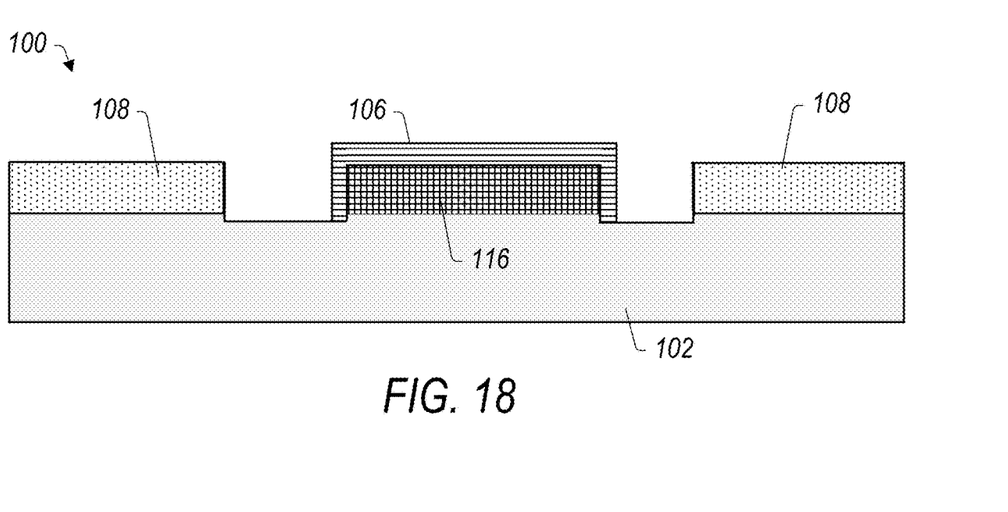
FIG. 18 depicts a cross-sectional representation of the substrate from FIG. 16 after proton exchange, according to some embodiments.
Figure 19:
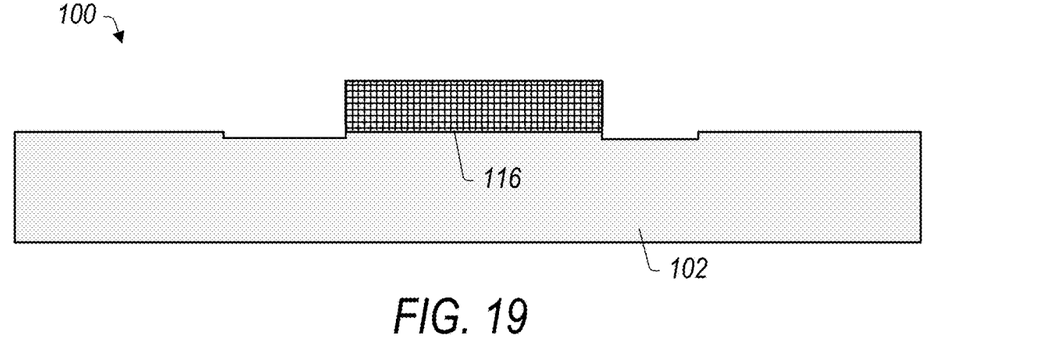
FIG. 19 depicts a cross-sectional representation of the substrate from FIG. 18 after removal of proton exchange material and the mask, according to some embodiments.

After the structure shown in FIG. 15 is formed, mask 106 (e.g., the proton exchange mask) may be formed to cover lithium niobate structure 116. FIG. 16 depicts a cross-sectional representation of substrate 100 from FIG. 15 with mask 106 formed, according to some embodiments. In the illustrated embodiment, mask 106 is formed conformally over lithium niobate structure 116 to protect the walls of the lithium niobate structure. Proton exchange treatment is then performed on substrate 100, as shown in FIG. 17. FIG. 18 depicts a cross-sectional representation of substrate 100 from FIG. 16 after proton exchange, according to some embodiments. As shown in FIG. 18, lithium niobate regions 152 are protonated to form proton exchanged regions 108 while lithium niobate structure 116 remains intact as unprotonated lithium niobate under mask 106. Proton exchanged regions 108 and mask 106 may then be removed by HF acid etching to form the structure of substrate 100 shown in FIG. 19.

Figure 20:
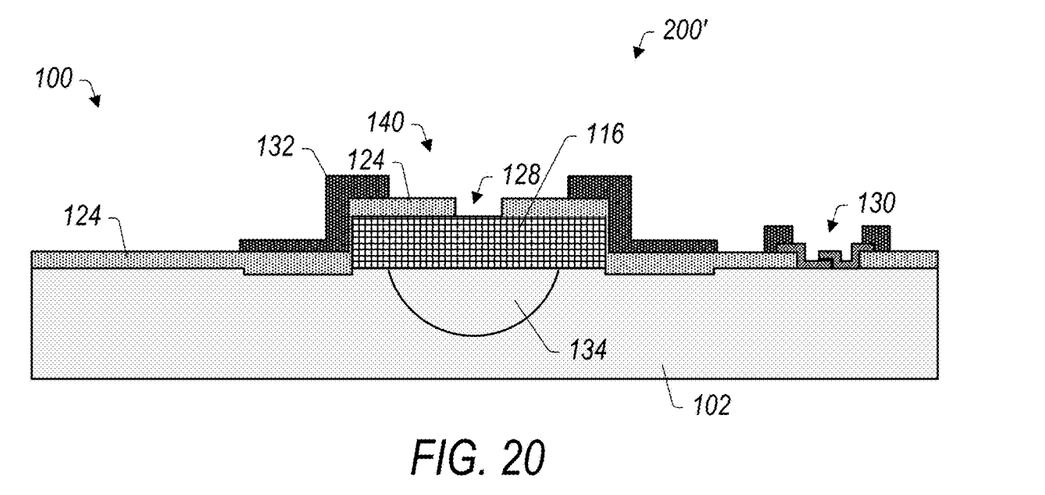
FIG. 20 depicts a cross-sectional representation of a substrate with an acoustic resonator and a nonlinear element formed on the substrate of FIG. 19, according to some embodiments

Deposition of superconducting electrode layer 124 and formation of nonlinear element 130 may then proceed similarly to the steps depicted in FIGS. 9-12 to form device 200' on substrate 100, shown in FIG. 20. In the illustrated embodiment of FIG. 20, superconducting electrode layer 124 and bandage layer 132 are flatter (e.g., are less stepped) in device 200' than for the embodiment of device 200 shown in FIG. 12. The embodiment of device 200' in FIG. 20 may have similar electrical properties to the embodiment of device 200 in FIG. 12.

In various embodiments, an additional wet etch HF acid (or other etchant) treatment may be implemented at any integration point during fabrication of device 200. Such an additional etchant treatment may be beneficial as an acoustic resonator surface treatment (e.g., a treatment of a surface of lithium niobate structure 116) since the additional etchant treatment may remove a minimal number of atomic layers. Removing one or more atomic layers can reduce surface TLS (two-level-system) density and improve intrinsic mechanical qualities in the device. In embodiments with additional etchant treatment, dimension changes due to the additional etching may be taken into account during other processing steps and/or the design of the device.

In some contemplated embodiments, the deposition and patterning of superconducting electrode layer 124 may be performed on the structure of substrate 100 shown in FIG. 4 with the steps described in FIGS. 5-8 (e.g., forming mask 110 and mask 112 followed by dry etching to form lithium niobate structure 116) being performed after the superconducting electrode layer 124 is formed. In such embodiments, the patterning of the acoustic resonator (e.g., patterning using mask 110 and mask 112) is aligned with the ground plane formed by superconducting electrode layer 124. Mask 110 and mask 112 may be resist masks used for protection during dry etching. Alternatively, hard masks may be used if dry etching will not consume the hard masks and the hard masks can be removed without affecting superconducting material or lithium niobate.

Example Fabrication Method of Standard Cell

Figure 21:
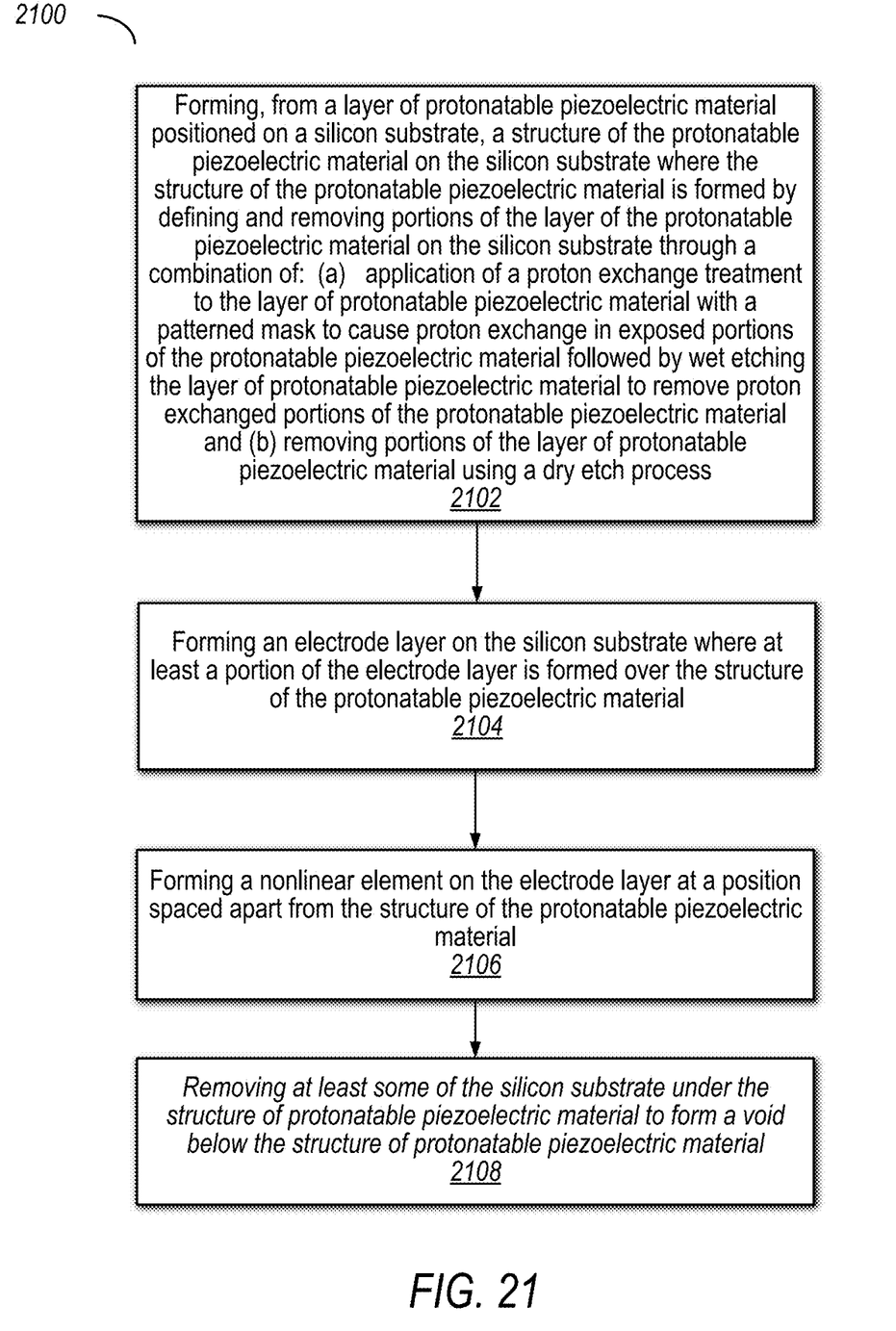
FIG. 21 is a flow diagram illustrating a method of fabrication of a device, according to some embodiments.

FIG. 21 is a flow diagram illustrating a method of fabrication of device 200, according to some embodiments. At 2102, in the illustrated embodiment, the method includes forming, from a layer of protonatable piezoelectric material positioned on a silicon substrate, a structure of the protonatable piezoelectric material on the silicon substrate where the structure of the protonatable piezoelectric material is formed by defining and removing portions of the layer of the protonatable piezoelectric material on the silicon substrate through a combination of: (a) application of a proton exchange treatment to the layer of protonatable piezoelectric material with a patterned mask to cause proton exchange in exposed portions of the protonatable piezoelectric material followed by wet etching the layer of protonatable piezoelectric material to remove proton exchanged portions of the protonatable piezoelectric material and (b) removing portions of the layer of protonatable piezoelectric material using a dry etch process.

At 2104, in the illustrated embodiment, the method includes forming an electrode layer on the silicon substrate where at least a portion of the electrode layer is formed over the structure of the protonatable piezoelectric material.

At 2106, in the illustrated embodiment, the method includes forming a nonlinear element on the electrode layer at a position spaced apart from the structure of the protonatable piezoelectric material.

At 2108, in the illustrated embodiment, the method includes removing at least some of the silicon substrate under the structure of protonatable piezoelectric material to form a void below the structure of protonatable piezoelectric material.

Illustrative Computer System

Figure 22:
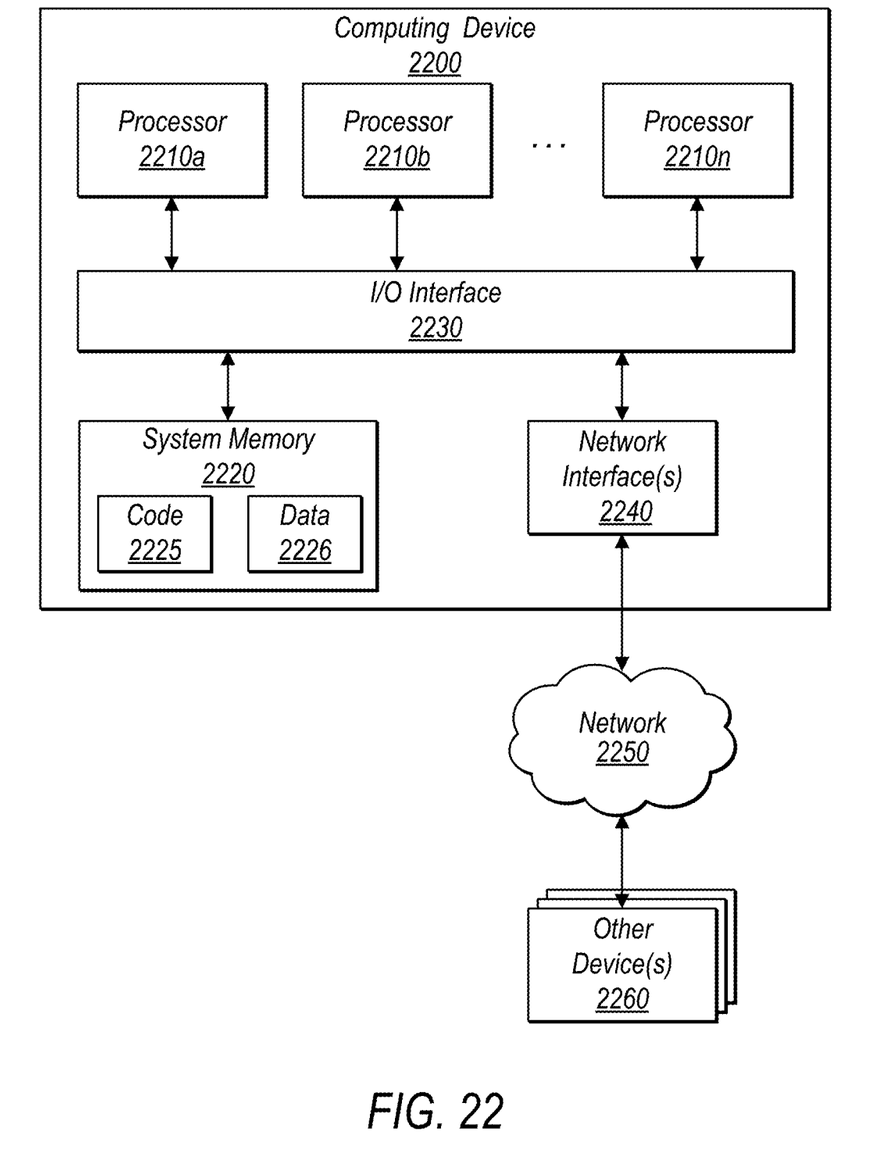
FIG. 22 is a block diagram illustrating an example computing device that may be used in at least some embodiments.

FIG. 22 is a block diagram illustrating an example computing device that may be used in at least some embodiments.

FIG. 22 illustrates such a general-purpose computing device 2200 as may be used in any of the embodiments described herein. In the illustrated embodiment, computing device 2200 includes one or more processors 2210 coupled to a system memory 2220 (which may comprise both non-volatile and volatile memory modules) via an input/output (I/O) interface 2230. Computing device 2200 further includes a network interface 2240 coupled to I/O interface 2230.

In various embodiments, computing device 2200 may be a uniprocessor system including one processor 2210, or a multiprocessor system including several processors 2210 (e.g., two, four, eight, or another suitable number). Processors 2210 may be any suitable processors capable of executing instructions. For example, in various embodiments, processors 2210 may be general-purpose or embedded processors implementing any of a variety of instruction set architectures (ISAs), such as the x86, PowerPC, SPARC, or MIPS ISAs, or any other suitable ISA. In multiprocessor systems, each of processors 2210 may commonly, but not necessarily, implement the same ISA. In some implementations, graphics processing units (GPUs) may be used instead of, or in addition to, conventional processors.

System memory 2220 may be configured to store instructions and data accessible by processor(s) 2210. In at least some embodiments, the system memory 2220 may comprise both volatile and non-volatile portions; in other embodiments, only volatile memory may be used. In various embodiments, the volatile portion of system memory 2220 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 2220 as code 2225 and data 2226.

In some embodiments, I/O interface 2230 may be configured to coordinate I/O traffic between processor 2210, system memory 2220, and any peripheral devices in the device, including network interface 2240 or other peripheral interfaces such as various types of persistent and/or volatile storage devices. In some embodiments, I/O interface 2230 may perform any necessary protocol, timing or other data transformations to convert data signals from one component (e.g., system memory 2220) into a format suitable for use by another component (e.g., processor 2210). In some embodiments, I/O interface 2230 may include support for devices attached through various types of peripheral buses, such as a variant of the Peripheral Component Interconnect (PCI) bus standard or the Universal Serial Bus (USB) standard, for example. In some embodiments, the function of I/O interface 2230 may be split into two or more separate components, such as a north bridge and a south bridge, for example. Also, in some embodiments some or all of the functionality of I/O interface 2230, such as an interface to system memory 2220, may be incorporated directly into processor 2210.

Network interface 2240 may be configured to allow data to be exchanged between computing device 2200 and other devices 2260 attached to a network or networks 2250, such as other computer systems or devices. In various embodiments, network interface 2240 may support communication via any suitable wired or wireless general data networks, such as types of Ethernet network, for example. Additionally, network interface 2240 may support communication via telecommunications/telephony networks such as analog voice networks or digital fiber communications networks, via storage area networks such as Fibre Channel SANs, or via any other suitable type of network and/or protocol.

In some embodiments, system memory 2220 may represent one embodiment of a computer-accessible medium configured to store at least a subset of program instructions and data used for implementing the methods and devices discussed in the context of FIG. 1 through FIG. 18. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 2200 via I/O interface 2230. A non-transitory computer-accessible storage medium may also include any volatile or non-volatile media such as RAM (e.g., SDRAM, DDR SDRAM, RDRAM, SRAM, etc.), ROM, etc., that may be included in some embodiments of computing device 2200 as system memory 2220 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 2240. Portions or all of multiple computing devices such as that illustrated in FIG. 22 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g., SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A method, comprising:
    forming, from a layer of protonatable piezoelectric material positioned on a silicon substrate, a structure of protonatable piezoelectric material on the silicon substrate, wherein the structure of the protonatable piezoelectric material is formed by defining and removing portions of the layer of the protonatable piezoelectric material on the silicon substrate through a combination of:
        (a) application of a proton exchange treatment to the layer of protonatable piezoelectric material with a patterned mask to cause proton exchange in exposed portions of the protonatable piezoelectric material followed by wet etching the layer of protonatable piezoelectric material to remove proton exchanged portions of the protonatable piezoelectric material; and
        (b) removing portions of the layer of protonatable piezoelectric material using a dry etch process;
    forming an electrode layer on the silicon substrate;
    forming a nonlinear element on the electrode layer at a position spaced apart from the structure of the protonatable piezoelectric material; and
    removing at least some of the silicon substrate under the structure of protonatable piezoelectric material to form a void below the structure of protonatable piezoelectric material.

2. The method of claim 1, wherein the protonatable piezoelectric material is lithium niobate.

3. The method of claim 1, wherein removing portions of the layer of protonatable piezoelectric material using the dry etch process includes forming a dry etch mask defining a pattern on the layer of protonatable piezoelectric material and removing portions of the layer of protonatable piezoelectric material exposed by the dry etch mask.

4. The method of claim 1, wherein the structure of the protonatable piezoelectric material is formed by performing (a) then (b).

5. The method of claim 1, wherein the structure of the protonatable piezoelectric material is formed by performing (b) then (a).

6. The method of claim 1, wherein at least a portion of the electrode layer is formed over the structure of the protonatable piezoelectric material, the method further comprising forming a first opening through the electrode layer to the structure of the protonatable piezoelectric material and a second opening through the electrode layer to the silicon substrate.

7. The method of claim 1, wherein the nonlinear element is a nonlinear superconducting element, and wherein the electrode layer is a superconducting electrode layer.

8. The method of claim 1, wherein the nonlinear element is formed at a location of an opening in the electrode layer exposing the silicon substrate.

9. The method of claim 8, wherein the opening in the electrode layer is located over a smooth portion of the silicon substrate, the smooth portion of the silicon substrate having a surface smoothness on the order of a polished silicon substrate.

10. The method of claim 1, further comprising forming one or more of the following electrodes in the electrode layer: an electrode that actuates and reads out mechanical motion, a transmission line, a waveguide resonator, and a ground plane.

11. The method of claim 1, wherein removing the at least some of the silicon substrate under the structure of protonatable piezoelectric material includes:
    forming a release mask over a portion of the structure of the protonatable piezoelectric material and the electrode layer, leaving a portion of the silicon substrate exposed; and
    removing silicon under the exposed portion of the structure of the protonatable piezoelectric material using an isotropic silicon etch process.

12. The method of claim 1, further comprising forming a bandage metal layer on the silicon substrate, wherein at least a portion of the bandage metal layer contacts at least the portion of the electrode layer formed over the structure of the protonatable piezoelectric material, and wherein at least a portion of the bandage metal layer contacts a portion of the nonlinear element.

13. The method of claim 1, wherein the proton exchange treatment includes placing the silicon substrate in a hydrogen rich acid.

14. A non-transitory computer readable storage medium storing a plurality of instructions which, when executed, generate a device according to steps, comprising:
    forming, from a layer of protonatable piezoelectric material positioned on a silicon substrate, a structure of protonatable piezoelectric material on the silicon substrate, wherein the structure of the protonatable piezoelectric material is formed by defining and removing portions of the layer of the protonatable piezoelectric material on the silicon substrate through a combination of:
    (a) application of a proton exchange treatment to the layer of protonatable piezoelectric material with a patterned mask to cause proton exchange in exposed portions of the protonatable piezoelectric material followed by wet etching the layer of protonatable piezoelectric material to remove proton exchanged portions of the protonatable piezoelectric material; and
    (b) removing portions of the layer of protonatable piezoelectric material using a dry etch process;
    forming an electrode layer on the silicon substrate;
    forming a nonlinear element on the electrode layer at a position spaced apart from the structure of the protonatable piezoelectric material; and
    removing at least some of the silicon substrate under the structure of protonatable piezoelectric material to form a void below the structure of protonatable piezoelectric material.

15. The non-transitory computer readable storage medium of claim 14, wherein removing portions of the layer of protonatable piezoelectric material using the dry etch process includes forming a dry etch mask defining a pattern on the layer of protonatable piezoelectric material and removing portions of the layer of protonatable piezoelectric material exposed by the dry etch mask.

16. The non-transitory computer readable storage medium of claim 14, wherein the structure of the protonatable piezoelectric material is formed by performing (a) then (b).

17. The non-transitory computer readable storage medium of claim 14, wherein the structure of the protonatable piezoelectric material is formed by performing (b) then (a).

18. The non-transitory computer readable storage medium of claim 14, wherein at least a portion of the electrode layer is formed over the structure of the protonatable piezoelectric material, the steps further comprising forming a first opening through the electrode layer to the structure of the protonatable piezoelectric material and a second opening through the electrode layer to the silicon substrate.

19. The non-transitory computer readable storage medium of claim 14, the steps further comprising forming one or more of the following electrodes in the electrode layer: an electrode that actuates and reads out mechanical motion, a transmission line, a waveguide resonator, and a ground plane.

20. The non-transitory computer readable storage medium of claim 14, wherein removing the at least some of the silicon substrate under the structure of protonatable piezoelectric material includes:
    forming a release mask over a portion of the structure of the protonatable piezoelectric material and the electrode layer, leaving a portion of the silicon substrate exposed; and
    removing silicon under the exposed portion of the structure of the protonatable piezoelectric material using an isotropic silicon etch process.

* * * * *